US009306192B2

(12) United States Patent  
Huh et al.

(10) Patent No.: US 9,306,192 B2  
(45) Date of Patent: Apr. 5, 2016

(54) DEPOSITION APPARATUS, METHOD FOR FORMING THIN FILM USING THE SAME, ORGANIC LIGHT EMITTING DISPLAY APPARATUS AND METHOD FOR MANUFACTURING THE SAME

(71) Applicant: Samsung Display Co., LTD, Yongin, Gyeonggi-do (KR)

(72) Inventors: Myung-Soo Huh, Yongin (KR); Sun-Ho Kim, Yongin (KR); Hyun-Woo Joo, Yongin (KR); Jae-Hyun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 57 days.

(21) Appl. No.: 13/965,182

(22) Filed: Aug. 12, 2013

(65) Prior Publication Data

US 2014/0291626 A1    Oct. 2, 2014

(30) Foreign Application Priority Data

Mar. 28, 2013 (KR) .................. 10-2013-0033667

(51) Int. Cl.
    *H01L 51/56*    (2006.01)
    *H01L 51/00*    (2006.01)
    *H01L 51/52*    (2006.01)

(52) U.S. Cl.
    CPC .............. *H01L 51/56* (2013.01); *H01L 51/001* (2013.01); *H01L 51/5253* (2013.01)

(58) Field of Classification Search
    CPC ....... H01L 21/09; H01L 21/20; H01L 21/411; H01L 21/568; H01L 21/132
    USPC ......... 438/240, 458, 622–624, 689, 785–787; 257/E21.568
    See application file for complete search history.

(56) References Cited

U.S. PATENT DOCUMENTS

| 4,013,539 | A  | * | 3/1977  | Kuehnle ............... 204/298.24 |
| 4,434,025 | A  | * | 2/1984  | Robillard .................. 117/86 |
| 5,153,072 | A  | * | 10/1992 | Ratner et al. ............. 428/461 |
| 5,273,618 | A  | * | 12/1993 | Komaki et al. ............. 117/98 |
| 2001/0002279 | A1 | * | 5/2001 | Forrest et al. .......... 427/255.26 |
| 2002/0018912 | A1 |   | 2/2002 | Jung et al. |
| 2002/0168859 | A1 | * | 11/2002 | Ehara et al. .............. 438/694 |

(Continued)

FOREIGN PATENT DOCUMENTS

| KR | 10-0360308 B1 |   | 11/2002 |
| KR | 2005054152    | * | 10/2005 |
| KR | 10-2010-0085347 A |   | 7/2013 |

*Primary Examiner* — Michael Lebentritt  
(74) *Attorney, Agent, or Firm* — Lewis Roca Rothgerber Christie LLP (57) ABSTRACT

A deposition apparatus is configured to form a deposition layer on a substrate. The deposition apparatus includes a deposition source configured to face a first side of the substrate and to spray one or more depositing materials toward the substrate, a cooling stage configured to support a second side of the substrate that is opposite from the first side of the substrate, and a hardening unit configured to harden the one or more depositing materials sprayed from the deposition source and that have reached the substrate. A method of forming a thin film deposition layer on a substrate by using a deposition apparatus is also provided. The method includes spraying one or more depositing materials toward the substrate by using a deposition source of the deposition apparatus while the substrate is on a cooling stage of the deposition apparatus.

5 Claims, 5 Drawing Sheets

(56) References Cited

U.S. PATENT DOCUMENTS

| | | | |
|---|---|---|---|
| 2003/0143834 A1* | 7/2003 | Morisaki et al. | 438/622 |
| 2003/0203210 A1 | 10/2003 | Graff et al. | |
| 2004/0041100 A1* | 3/2004 | Maezawa et al. | 250/484.4 |
| 2004/0217702 A1* | 11/2004 | Garner et al. | 313/512 |
| 2004/0259305 A1* | 12/2004 | Demaray et al. | 438/240 |
| 2006/0062900 A1* | 3/2006 | Selvamanickam | 427/62 |
| 2007/0105473 A1* | 5/2007 | Lee et al. | 445/25 |
| 2010/0084742 A1* | 4/2010 | Sazawa et al. | 257/615 |
| 2010/0181903 A1 | 7/2010 | Kim et al. | |
| 2010/0297786 A1* | 11/2010 | Terashima et al. | 438/16 |
| 2011/0030615 A1* | 2/2011 | Griffin et al. | 118/666 |
| 2011/0111558 A1* | 5/2011 | Yamazaki et al. | 438/104 |
| 2013/0052799 A1* | 2/2013 | Ohki | 438/458 |
| 2013/0134388 A1* | 5/2013 | Ueda et al. | 257/13 |

\* cited by examiner

FIG. 10

DEPOSITION APPARATUS, METHOD FOR FORMING THIN FILM USING THE SAME, ORGANIC LIGHT EMITTING DISPLAY APPARATUS AND METHOD FOR MANUFACTURING THE SAME

CROSS-REFERENCE TO RELATED APPLICATIONS

This application claims priority to and the benefit of Korean Patent Application No. 10-2013-0033667, filed on Mar. 28, 2013 in the Korean Intellectual Property Office, the entire content of which is incorporated herein by reference.

BACKGROUND

1. Field

Aspects of embodiments of the present invention relate to a deposition apparatus, a method for forming a thin film using the deposition apparatus, an organic light emitting display apparatus, and a method for manufacturing the organic light emitting display apparatus.

2. Description of the Related Art

Semiconductor devices, display apparatuses, and other electric devices may include multiple thin films. Deposition is one of various methods for creating the thin film in such devices.

Organic light emitting display apparatuses have drawn a lot of attention as display apparatuses for the next generation. Organic light emitting display apparatuses have a wide viewing angle, excellent contrast, and fast response speed.

An example organic light emitting display apparatus includes a first electrode, a second electrode, and an interlayer (or intermediate layer) between the first and second electrodes. The organic light emitting display apparatus also includes an encapsulating layer (or encapsulating unit) that protects the first and second electrodes, the interlayer, and other elements. The encapsulating layer may include multiple layers to improve the encapsulating quality; the multiple layers may be formed through a deposition method.

However, forming an encapsulating layer is not an easy process. Particles or other such objects or surface irregularities (which will all be herein referred to as simply "particles") may interfere with the encapsulating process. One purpose of the encapsulating layer is to cover such particles and prevent them from being exposed to prevent future malfunctions and to keep the display apparatus functioning as designed. Such an encapsulating process may require a long time and it may not be easy to make the encapsulating layer as thick as desired (for example, to cover all of the particles). Hence, it is difficult to improve encapsulating quality of the encapsulating layer.

SUMMARY

Embodiments of the present invention provide for a deposition apparatus that may improve a deposition layer quality and an encapsulation quality, a method for forming a thin layer by using the deposition apparatus, an organic light emitting display apparatus, and a method for manufacturing the organic light emitting display apparatus.

According to an example embodiment of the present invention, a deposition apparatus is provided. The deposition apparatus is configured to form a deposition layer on a substrate. The deposition apparatus includes a deposition source configured to face a first side of the substrate and to spray one or more depositing materials toward the substrate, a cooling stage configured to support a second side of the substrate that is opposite from the first side of the substrate, and a hardening unit configured to harden the one or more depositing materials sprayed from the deposition source and that have reached the substrate.

The cooling stage may be configured to contact the substrate.

The cooling stage may be at least as large as the substrate.

The cooling stage may include a cooling tunnel configured to circulate a cooling material.

The deposition source may include one or more nozzles to spray the one or more depositing materials.

The deposition source may be in a form of a showerhead.

The hardening unit may be farther from the substrate than the deposition source.

The hardening unit may be configured to radiate ultraviolet light toward the substrate.

The apparatus may further include a support member that supports the deposition source and the hardening unit.

The support member may surround sides of the deposition source.

The hardening unit may include multiple hardening members having a length in a first direction at least that of the substrate in the first direction.

According to another example embodiment of the present invention, a method of forming a thin film deposition layer on a substrate by using a deposition apparatus is provided. The method includes spraying one or more depositing materials toward the substrate by using a deposition source of the deposition apparatus while the substrate is on a cooling stage of the deposition apparatus.

The one or more depositing materials may include an organic material.

The method may further include hardening the one or more depositing materials by using a hardening unit of the deposition apparatus after the sprayed one or more depositing materials have reached the substrate.

According to yet another example embodiment of the present invention, a method of manufacturing an organic light emitting display apparatus is provided. The method includes: forming, on a substrate, an organic light emitting device that includes a first electrode, a second electrode, and an intermediate layer that includes an organic light emitting layer; and forming, on the organic light emitting device, an encapsulating layer that includes an inorganic layer and an organic layer. The forming of the encapsulating layer includes forming the inorganic layer, and forming the organic layer to cover one or more particles on the inorganic layer and to have a curved surface corresponding to a shape of each of the one or more particles.

The forming of the organic layer may include spraying a depositing material including an organic material toward the substrate by using a deposition source while the substrate is on a cooling stage.

The forming of the organic layer may further include hardening the depositing material by using a hardening unit after the sprayed depositing material has reached the substrate.

According to still yet another example embodiment of the present invention, an organic light emitting display apparatus is provided. The organic light emitting display apparatus includes: a substrate; an organic light emitting device on the substrate and including a first electrode, a second electrode, and an intermediate layer including an organic light emitting layer; an encapsulating layer on the organic light emitting device and including at least an inorganic layer and an organic layer on the inorganic layer; and one or more particles between the inorganic layer and the organic layer. The organic layer has curved surfaces corresponding to shapes of the one or more particles.

A thickness of the organic layer may be smaller than a height of the one or more particles.

The apparatus may further include one or more inorganic layers or organic layers on the encapsulating layer.

DETAILED DESCRIPTION

Detailed description of construction and operation of embodiments of the present invention will now be provided with reference to the appended drawings. Herein, the use of the term "may" when describing embodiments of the present invention refers to "one or more embodiments of the present invention." In addition, the use of alternative language, such as "or," when describing embodiments of the present invention refers to "one or more embodiments of the present invention" for each corresponding item listed.

Figure 1:
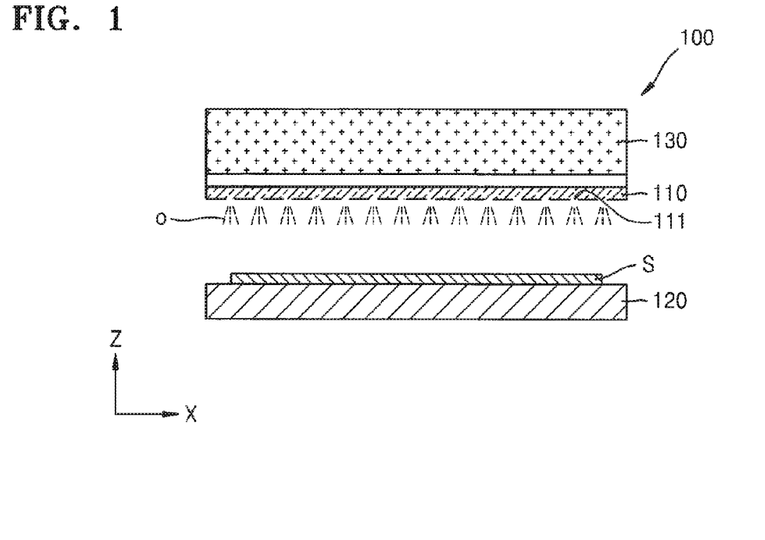
FIG. 1 is a cross-sectional view illustrating a deposition apparatus according to an embodiment of the present invention.

FIG. 1 is a cross-sectional view illustrating a deposition apparatus 100 according to an embodiment of the present invention. The deposition apparatus 100 includes a deposition source 110, a cooling stage 120, and a hardening unit 130.

Additionally, a chamber (such as a vacuum chamber) may also be provided in order to maintain an environment (such as a vacuum or near vacuum environment) of a depositing place where a deposition process takes place. The chamber may also be connected to a pump to control an atmospheric pressure of the deposition process.

The deposition source 110 may include one or more nozzles 111 to spray a depositing material toward a substrate S. The deposition source 110 may be provided in a form of a showerhead including multiple nozzles 111. Here, the deposition source 110 may be at least as large (for example, when comparing opposing surface areas) as the substrate S. Thus, even when the deposition source 110 and the substrate S are fixed at certain positions, it is possible to spray the depositing material evenly, efficiently, and easily.

The deposition source 110 may spray various depositing materials toward the substrate S. For example, an organic depositing material O may be sprayed toward the substrate S.

The substrate S is provided on top of the cooling stage 120 to face the deposition source 110. To fix the substrate S onto the cooling stage 120, a device such as a clamp may be used.

When the depositing material has been sprayed from the deposition source 110 and has landed on or reached the substrate S, the cooling stage 120 cools the depositing material to reduce fluidity of the depositing material. Thus, the depositing material is restrained from moving or spreading out. The organic depositing material O is highly fluid; when the organic depositing material O lands on or reaches the substrate, the material O may move or spread out easily, which may thin the layer of depositing material O or cause it to expose particles on the substrate S. However, according to an embodiment of the present invention, the fluidity of the organic depositing material O is significantly reduced due to the cooling effect from the cooling stage 120. As a result, the deposition layer containing the organic depositing material O is restrained from forming a flat-surfaced layer on the substrate (such as becoming too thin or exposing particles or other such structures or surface irregularities, herein all referred to as simply "particles"). Thus, even if there are particles that are thicker than the deposition layer (for example, thicker than an average thickness of the deposition layer) on the substrate S, the deposition layer may easily cover the particles.

The cooling stage 120 may be in contact with the substrate S, which may improve (for example, speed up) the cooling effect of the cooling stage 120 on the deposition layer. In addition, the cooling stage 120 may include a cooling material such as a refrigerant (such as refrigerant 222 in FIG. 3) in order to maintain a cooling temperature of the cooling stage 120. Thus, the cooling stage 120 may keep the surface temperature of the cooling stage below 0° C. For enhanced cooling, in some embodiments, the cooling stage may keep the surface temperature of the cooling stage below −30° C.

The hardening unit 130 is provided on the upper part of the deposition source 110. For example, the hardening unit 130 may face the substrate S. The hardening unit 130 hardens (or accelerates the hardening of) the depositing material that was sprayed from the deposition source 110 and has landed on or reached the substrate S. For example, the hardening unit 130 may radiate ultraviolet light toward the substrate S.

The following is a brief description of the operation and effects of the deposition apparatus 100 according to one embodiment of the present invention. The deposition apparatus 100 is provided with the deposition source 110 to form the deposition layer on the substrate S. The deposition source 110 sprays the depositing material, for example, the organic depositing material O, toward the substrate S.

The depositing material moves and spreads out on the substrate and forms the deposition layer. Especially when the depositing material has a high fluidity, the depositing material may move and form a flat-surfaced layer (such as a thinner layer or one with exposed particles) on the substrate S. In this case, when there are particles on the substrate and the deposition layer is not thick enough to cover these surface effects (for example, an average thickness of the deposition layer is less than a height of the particles), it may expose the tops of the particles. When the particles are exposed, materials or impurities may leak through or penetrate the deposition layer, for example, in spaces between the particles and the deposition layer. Furthermore, when a next layer is formed afterwards and lies on the deposition layer, the exposed particles may have their tops touch the newly formed layer, which may lead to malfunctions of the product or cause the product to not function as designed.

According to one embodiment of the present invention, the cooling stage 120 is provided under the substrate S and cools the substrate S. The cooling stage 120 thereby lowers a temperature of the depositing material on the substrate S, reduces the kinetic energy of the depositing material, and thus restrains the fluidity of the deposition material, which means the deposition material is restrained from moving or spreading out on the substrate S. Therefore, even if there are relatively large particles on the substrate S, the depositing material may easily cover the particles without discontinuities in the deposition material (such as holes in the deposition layer). In other words, the depositing material does not move and form a flat-surfaced layer and expose the tops of the particles. Instead, the depositing material lands on or reaches the substrate S and continues to cover the particles. At the end, the deposition layer does not have a flat surface but rather a curved surface along the shape of the particles. Thus, any malfunctions that may be caused by the particles are avoided, and the display apparatus may function as intended.

The hardening unit 130 quickly hardens (for example, accelerates the hardening of) the depositing material that has landed on or reached the substrate S, and thereby reduces the fluidity of the depositing material. Accordingly, the hardening unit 130, like the cooling stage 120, also restrains the depositing material from moving, spreading out, and getting flat. Thus, the depositing material covers the particles, preventing exposure of the particles as much as possible.

As such, the hardening unit 130 may work in concert with the cooling stage 120, both components accelerating the conversion of the depositing material from a highly fluid material to a solid or a material with significantly less fluidity. For example, the cooling stage 120 may engage one side of the depositing material, reducing the fluidity through a drop in temperature, while the hardening unit may engage the other side of the depositing material, reducing the fluidity through a chemical transformation (such as exposing the depositing material to ultraviolet radiation).

Figure 2:
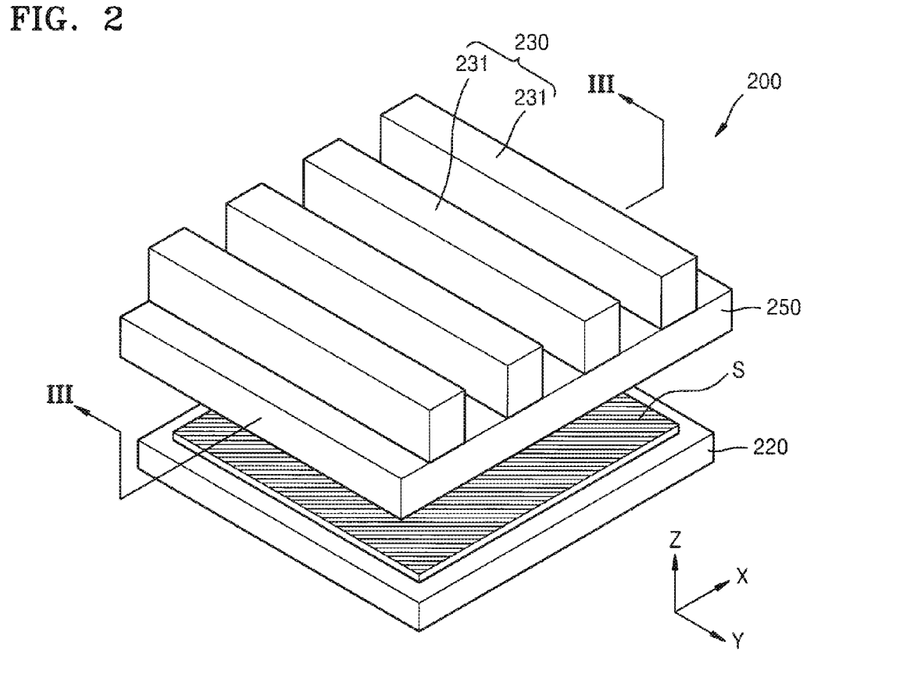
FIG. 2 is a perspective view illustrating a deposition apparatus according to another embodiment of the present invention.
Figure 3:
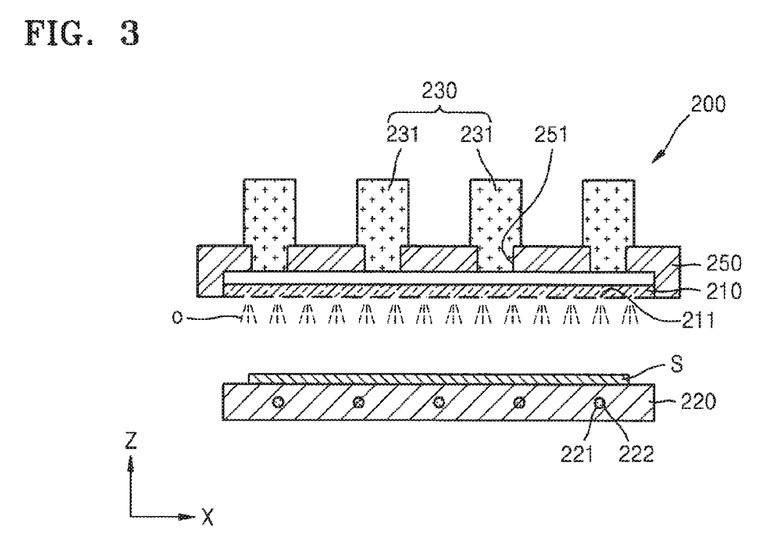
FIG. 3 is a cross-sectional view taken along the Line III-III of FIG. 2.

FIG. 2 is a perspective view illustrating a deposition apparatus 200 according to another embodiment of the present invention. FIG. 3 is a cross-sectional view taken along the Line III-III of FIG. 2. Referring to FIGS. 2 and 3, the deposition apparatus 200 includes a deposition source 210, a cooling stage 220, a hardening unit 230, and a support member 250.

Additionally, a chamber (such as a vacuum chamber) may be also provided in order to maintain an environment (such as a vacuum or near vacuum environment) of a depositing location where a deposition process takes place. The chamber may be also connected to a pump to control pressure inside the chamber during the deposition process.

The deposition source 210 may include one or more nozzles 211 to spray a depositing material toward a substrate S. The deposition source 210 may be provided in a form of a showerhead including multiple nozzles 211. Here, the deposition source 210 may be at least as large as the substrate S. Thus, even when the deposition source 210 and the substrate S are fixed at certain positions, it is possible to spray the depositing material evenly, efficiently, and easily.

The deposition source 210 may spray various depositing materials toward the substrate S. For example, an organic depositing material O may be sprayed toward the substrate S.

The hardening unit 230 is located on top of the deposition source 210. In other words, the hardening unit 230 is located on a side of the deposition source 210 that is opposite from the side of the deposition source 210 that faces the substrate S, with the deposition source 210 therebetween. The hardening unit 230 hardens (or accelerates the hardening of) the deposition material that has been sprayed from the deposition source 210 and has landed on the substrate S. In order to harden the depositing material, the hardening unit 230 may radiate ultraviolet light toward the substrate S.

The hardening unit 230 in FIGS. 2 and 3 includes multiple hardening members 231. The hardening members 231 each have a long, extended shape. Each hardening member 231 may be at least as long in a first direction as the length of the substrate S in the first direction, so that there is an equal or even deposition layer quality throughout the whole substrate S. The number of the hardening members 231 may be decided differently depending on the size of the substrate S and the desired quality of the depositing layer.

The support member 250 supports the deposition source 210 and the hardening unit 230. The support member 250 may be larger than the deposition source 210 so that the support member 250 surrounds the deposition source 210 (for example, the support member 250 may surround sides of the deposition source 210). In some embodiments, the support member 250 may serve as a housing and house the deposition source 210. The support member 250 also provides a set space (such as a predetermined space) for surrounding the deposition source 210. The hardening unit 230 is located on top of the support member 250 and may be attached to the top of the support member 250. More specifically, a lower area of the hardening member 231 may correspond to a window 251 of the support member 250. The window 251 may be in a form of a through hole. In addition, the window 251 may be formed of a transparent material. The hardening member 231 may radiate the ultraviolet light through the window 251 toward the substrate S.

The substrate S faces the deposition source 210. More particularly, the substrate S is located on the cooling stage 220. A device such as a clamp may be used to fix the substrate S onto the cooling stage 220.

When the depositing material has been sprayed from the deposition source 210 and has landed on the substrate S, the cooling stage 220 cools the depositing material to reduce fluidity of the depositing material. Thus, the depositing material is restrained from moving or spreading out. The organic depositing material O is highly fluid, and thus may easily move or spread out on the substrate S. However, according to one embodiment of the present invention, the fluidity of the organic depositing material O is significantly reduced due to the cooling effect from the cooling stage 220. As a result, the deposition layer containing the organic depositing material O is restrained from getting flat. Thus, even if there particles thicker than (for example, having a greater height than an average thickness of) the deposition layer lying on the substrate S, the deposition layer may easily cover the particles.

To enhance the cooling effect, the cooling stage 220 may be in contact with the substrate S. In addition, the cooling stage 220 may be provided with a cooling tunnel 221 on the inside to maintain a cooling temperature of the cooling stage 220, through which a cooling material such as a refrigerant 222 circulates. Thus, the cooling stage 220 may keep the surface temperature below 0° C. To further enhance the cooling effect, the cooling stage may keep the surface temperature of the cooling stage below −30° C.

The following is a brief description of an operation and effects of the deposition apparatus 200 according to one embodiment of the present invention. The deposition apparatus 200 is provided with the deposition source 210 to form the deposition layer on the substrate S. The deposition source 210 sprays the depositing material, for example, an organic depositing material O, toward the substrate S.

According to one embodiment of the present invention, the cooling stage 220 located under the substrate S cools down the substrate S, and thereby lowers the temperature of the depositing material that is sitting on the substrate. This reduces the kinetic energy of the depositing material, and thus restrains the fluidity of the depositing material. Accordingly, the depositing material is restrained from moving or spreading out on the substrate S. Therefore, even if there are relatively large particles on the substrate S, the depositing material may easily cover the particles. In other words, the depositing material does not expose the tops of the particles by moving and getting flat. Instead, the depositing material continues to cover and coat the particles. At the end, the deposition layer does not have a flat surface but rather a curved surface along or corresponding to the shapes of the particles. Thus, any malfunctions that may be caused by the particles are avoided, and the display apparatus may function as intended.

The hardening unit 230 quickly hardens the depositing material that has landed on the substrate S, thereby reducing the fluidity of the depositing material. The hardening unit 230, like the cooling stage 220, restrains the depositing material from moving, spreading out, and getting flat. Thus, the depositing material covers the particles, preventing exposure of the particles as much as possible.

In addition, the positions of the deposition source 210 and the hardening unit 230 may be fixed by using the support member 250, thereby maintaining a consistency of the quality of the deposition source 210 and the quality of the hardening unit 230.

Figure 4:
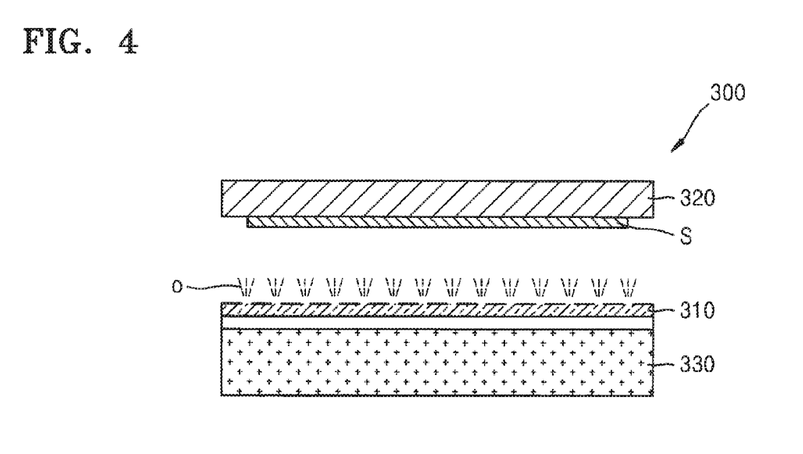
FIG. 4 is a cross-sectional view illustrating a deposition apparatus according to another embodiment of the present invention.

FIG. 4 is a cross-sectional view illustrating a deposition apparatus 300 according to another embodiment of the present invention. The deposition apparatus 300 includes a deposition source 310, a cooling stage 320, and a hardening unit 330.

The substrate S is located above the deposition source 310. In other words, while one embodiment described with reference to FIG. 1 had the substrate S located under the deposition source 110, thereby having the substrate closer to the ground (that is, a source of gravity) than the deposition source 110, the embodiment of FIG. 4 has the substrate S located above the deposition source 310, thus having the substrate farther from the ground than the deposition source 310.

The deposition source 310, the cooling stage 320, and the hardening unit 330 are respectively similar to the deposition source 110, the cooling stage 120, and the hardening unit 130 of the deposition apparatus 100 of FIG. 1. Therefore, detailed descriptions thereof will not be repeated. In addition, as in the deposition apparatus 300 of the embodiment of FIG. 4, the deposition apparatus 200 of FIGS. 2 and 3 may also reverse the positions of the substrate S and the deposition source 210.

Figure 5:
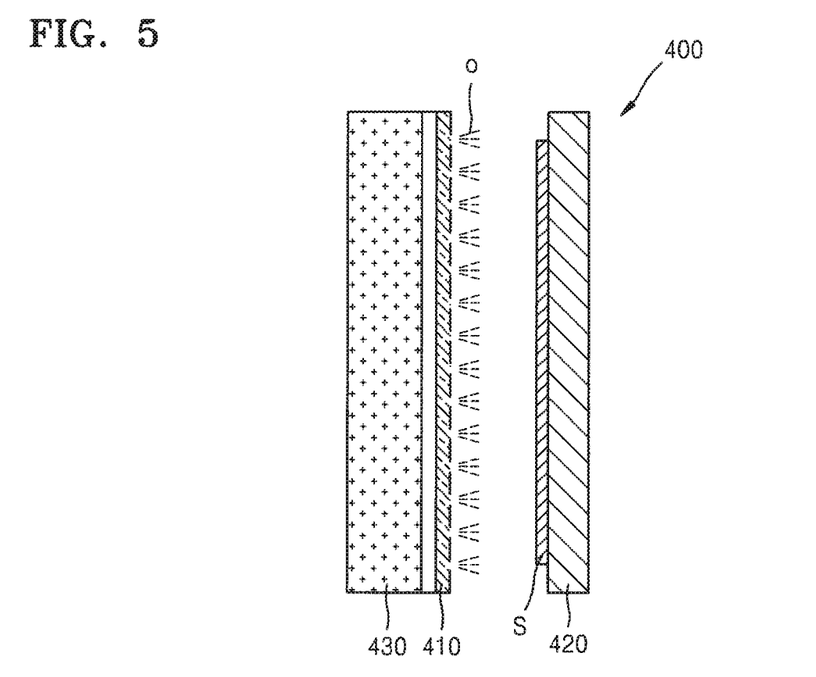
FIG. 5 is a cross-sectional view illustrating a deposition apparatus according to another embodiment of the present invention.

FIG. 5 is a cross-sectional view illustrating a deposition apparatus 400 according to another embodiment of the present invention. The deposition apparatus 400 includes a deposition source 410, a cooling stage 420, and a hardening unit 430.

The substrate S in FIG. 5 is perpendicular to the ground. In other words, the surface of the substrate S to which the deposition process is going to be performed is located perpendicular to the ground. The deposition source 410 faces the substrate S. Comparing FIG. 5 to FIG. 1, while the deposition apparatus 100 of FIG. 1 has the substrate S under the deposition source 110 and thereby has the substrate S parallel to the ground, the deposition apparatus 400 of FIG. 5 has the substrate S perpendicular to the ground.

The deposition source 410, the cooling stage 420, and the hardening unit 430 are respectively similar to the deposition source 110, the cooling stage 120, and the hardening unit 130 of the deposition apparatus 100 of FIG. 1. Therefore, detailed descriptions thereof will not be repeated. In addition, the deposition apparatus 200 of FIGS. 2 and 3 may have the substrate S perpendicular to the ground and the deposition source 210 may face the substrate S as in the deposition apparatus 400 of FIG. 5.

Figure 6:
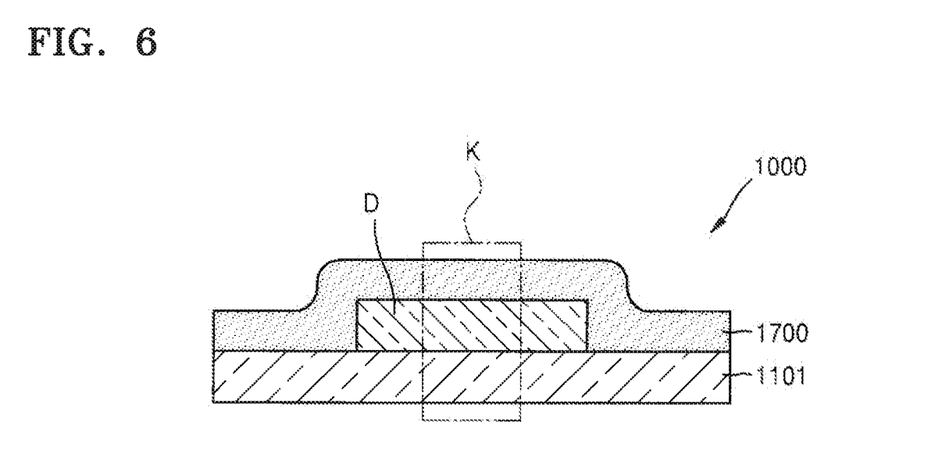
FIG. 6 is a cross-sectional view illustrating an example organic light emitting display apparatus that has been manufactured by using a deposition apparatus according to an embodiment of the present invention.
Figure 7:
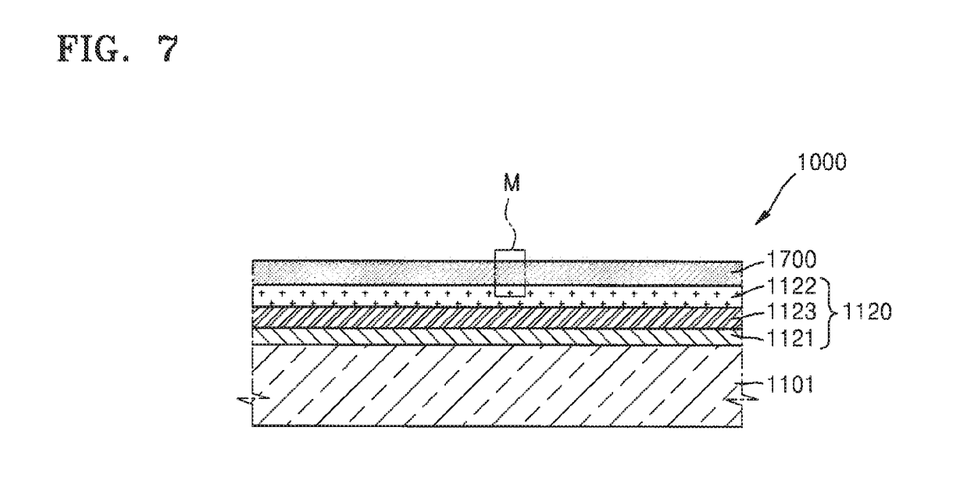
FIG. 7 is an enlarged view of Region K of FIG. 6.

FIG. 6 is a cross-sectional view illustrating an example organic light emitting display apparatus 1000 that has been manufactured by using a deposition apparatus according to an embodiment of the present invention. FIG. 7 is an enlarged view of Region K of FIG. 6, and FIG. 8 is an enlarged view of Region M of FIG. 7.

Figure 8:
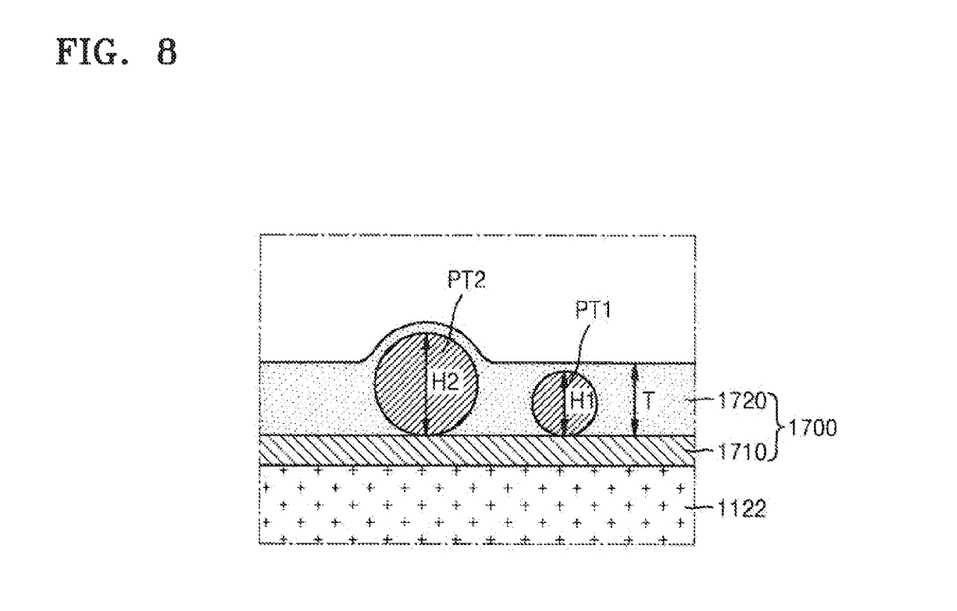
FIG. 8 is an enlarged view of Region M of FIG. 7.

Referring to FIGS. 6 to 8, the organic light emitting display apparatus 1000 includes a substrate 1101, a display unit D, and an encapsulating layer 1700. The display unit D at least includes an organic light emitting device 1120. The organic light emitting device 1120 includes a first electrode 1121, a second electrode 1122, and an interlayer (or intermediate layer) 1123. Here, the encapsulating layer 1700 is covering the top and sides of the display unit D.

The following is a detailed description of each element. The substrate 1101 may be formed of a glass material, a metal, or a plastic material. Especially when the substrate 1101 is formed of a plastic material, it is possible to manufacture a flexible organic light emitting display apparatus 1000.

The first electrode 1121 is formed on the substrate 1101. The first electrode 1121 may include Indium Tin Oxide (ITO), Indium Zinc Oxide (IZO), Zinc Oxide (ZnO), or Indium Oxide ($In_2O_3$), as well as similar such compounds or combinations of these compounds. In addition, depending on a purpose and a design condition, the first electrode 1121 may further include a reflective film that is formed of Silver (Ag), Magnesium (Mg), Aluminum (Al), Platinum (Pt), Palladium (Pd), Gold (Au), Nickel (Ni), Neodymium (Nd), Iridium (Ir), Chromium (Cr), Lithium (Li), Ytterbium (Yb), or Ca (Calcium), and as well as similar such metals or alloys of these metals.

In some embodiments, there may be a buffer layer between the substrate 1101 and the first electrode 1121. The buffer layer prevents or helps prevent any impurities (such as impure chemical elements) or other undesired substances from leaking into the substrate 1101, and also provides a flat surface on the substrate 1101. Various materials that may provide those functions may be used to form the buffer layer. For example, the buffer layer may include inorganic materials such as silicon oxide, silicon nitride, silicon oxynitride, aluminum oxide, aluminum nitride, titanium oxide, or titanium nitride, or organic materials such as polyimide, polyester, or acrylic. The buffer layer may be formed of multiple layers of these compounds.

The intermediate layer 1123 is formed on the first electrode 1121. The intermediate layer 1123 includes an organic light emitting layer for emitting visible light. The intermediate layer 1123 may be formed as an organic layer of a low molecule or a high molecule. In addition, the intermediate layer 1123 may selectively include one or more of a hole injection layer (HIL), a hole transport layer (HTL), an electron transport layer (ETL), and an electron injection layer (EIL). The second electrode 1122 is formed on the intermediate layer 1123. The second electrode 1122 may be formed of one or more metals such as Silver (Ag), Magnesium (Mg), Aluminum (Al), Platinum (Pt), Palladium (Pd), Gold (Au), Nickel (Ni), Neodymium (Nd), Iridium (Ir), Chromium (Cr), Lithium (Li), or Ca (Calcium).

The encapsulating layer 1700 may be formed on the second electrode 1122. The encapsulating layer 1700 includes an inorganic layer 1710 and an organic layer 1720. According to some embodiments of the present invention, the forming of the organic layer 1720 of the encapsulating layer 1700 is done using one of the deposition apparatuses 100, 200, 300, 400 from earlier embodiments described above.

The inorganic layer 1710 is formed on the second electrode 1122. The inorganic layer 1710 may be formed of various inorganic materials.

The organic layer 1720 is formed on the inorganic layer 1710. Before or while the organic layer 1720 is formed, one or more particles PT1 and PT2 may be located on the inorganic layer 1710. There may be various types for the particles PT1 and PT2 (such as general surface irregularities). For example, the particles PT1 and PT2 may have come from the external environment, may be inorganic materials left after forming the inorganic layer 1710, may be materials left after forming the organic light emitting device 1120, or may be a combination of organic materials, inorganic materials, or organic/inorganic complex materials.

The organic layer 1720 is formed on the inorganic layer 1710. Here, the particle PT1 has a height H1 that is smaller than the thickness T (such as the average thickness) of the organic layer 1720, and thereby the particle PT1 is covered by the organic layer 1720. In other words, the particle PT1 is not exposed to the outside and does not cause any malfunction to the organic light emitting display apparatus 1000.

However, the particle PT2 has a height H2 that is taller than the thickness T of the organic layer 1720. In this case, if the organic layer 1720 is formed by using a conventional deposition apparatus, the depositing material (the organic layer 1720) moves, spreads out, and forms a flat-surfaced layer on the substrate 1101, resulting in the particle PT2 being partly exposed and uncovered. In order to prevent this exposure as a result of using the conventional deposition apparatus, the thickness T of the organic layer 1720 has to be made greater than the height H2 of the particle PT2, which requires a longer time for the deposition process. In addition, the organic layer 1720 may have an unwanted thickness as a result.

However, if the organic layer 1720 is formed by using one of the deposition apparatuses 100, 200, 300, and 400, when the deposition material (the organic layer 1720) is sprayed toward and lands on the inorganic layer 1710, the corresponding cooling stage 120, 220, 320, or 420 lowers the temperature of the depositing material and reduces fluidity of the depositing material. In other words, the corresponding cooling stage 120, 220, 320, or 420 restrains the depositing material from easily moving and spreading out. As a result, the depositing material lands on the particle PT2, but does not run down from the particle. The depositing material is hardened while staying on the particle PT2, and covers the particle PT2 as part of the organic layer 1720. At the end, the organic layer 1720 has a curved surface along the shape of the particle PT2, rather than a flat surface with a portion of the particle PT2 exposed. Thus, the particle PT2 is not exposed to the outside, thereby preventing any malfunctions of the organic light emitting display apparatus 1000 that may be caused due to the particle PT2.

Figure 9:
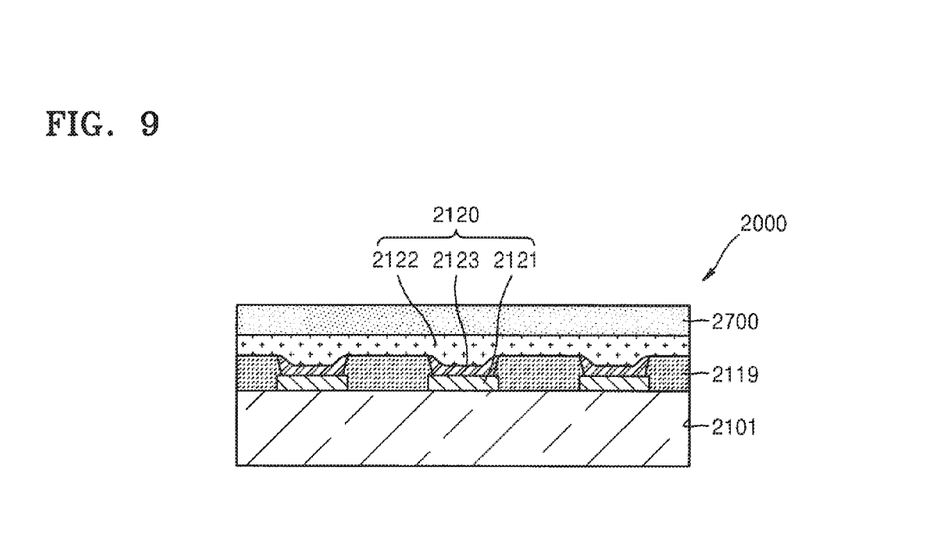
FIG. 9 is a cross-sectional view illustrating another example organic light emitting display apparatus that has been manufactured by using a deposition apparatus according to an embodiment of the present invention.

FIG. 9 is a cross-sectional view illustrating another example organic light emitting display apparatus 2000 that has been manufactured by using a deposition apparatus according to an embodiment of the present invention. The organic light emitting display apparatus 2000 includes a substrate 2101, a organic light emitting device 2120, and an encapsulating layer 2700, in which the organic light emitting device 2120 includes a first electrode 2121, a second electrode 2122, and an intermediate layer 2123. For convenience, the following will mainly describe what is different from the previous embodiments.

The first electrode 2121 is formed on the substrate 2101. A pixel defining layer 2119 that uses an insulating layer is formed on the first electrode 2121. Here, the pixel defining layer 2119 has an open space for exposing the upper area of the first electrode 2121.

The intermediate layer 2123 is formed on the exposed area of the first electrode 2121. The intermediate layer 2123 includes an organic light emitting layer for emitting visible light. The second electrode 2122 is formed on the intermediate layer 2123.

The encapsulating layer 2700 is formed on the second electrode 2122. The encapsulating layer 2700 includes an inorganic layer and an organic layer. At least the organic layer of the encapsulating layer 2700 is formed by using one of the deposition apparatuses 100, 200, 300, and 400 of the previous embodiments of the present invention. Since the encapsulating layer 2700 has a similar composition to the compositions of the encapsulating layers in FIGS. 6 to 8, detailed descriptions thereof will not be repeated.

Figure 10:
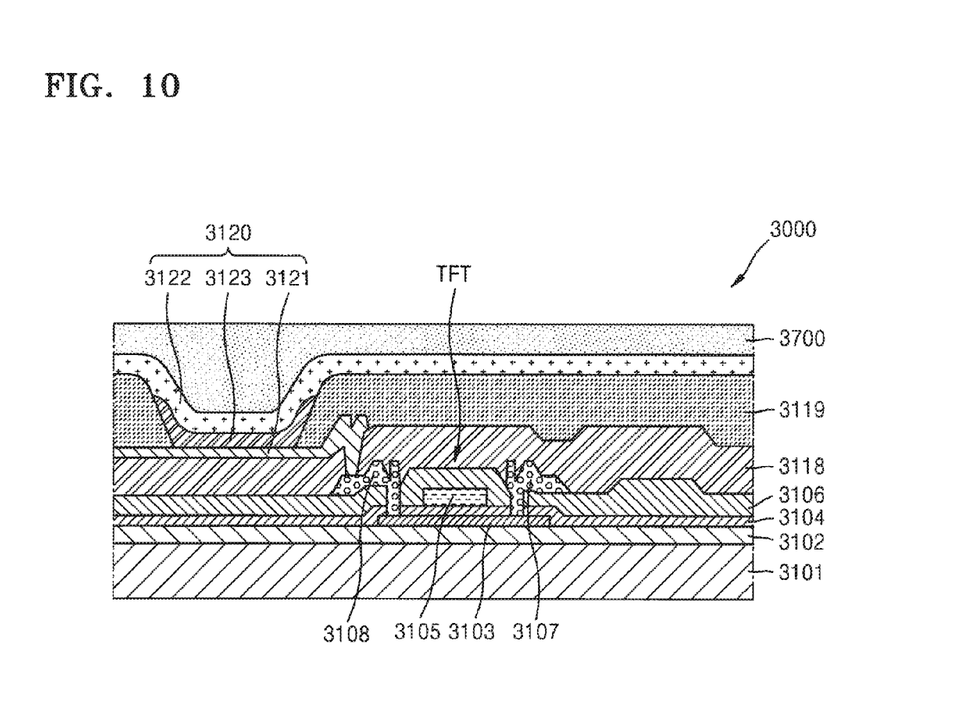
FIG. 10 is a cross-sectional view illustrating another example organic light emitting display apparatus that has been manufactured by using a deposition apparatus according to an embodiment of the present invention.

FIG. 10 is a cross-sectional view illustrating another example organic light emitting display apparatus 3000 that has been manufactured by using a deposition apparatus according to an embodiment of the present invention. The organic light emitting display apparatus 3000 includes a substrate 3101, an organic light emitting device 3120, a thin film transistor (TFT), and an encapsulating layer 3700.

The organic light emitting device 3120 includes a first electrode 3121, a second electrode 3122, and an intermediate layer 3123. The TFT mainly includes an active layer 3103, a gate electrode 3105, a source electrode 3107, and a drain electrode 3108.

A buffer layer 3102 is formed of an insulating material to prevent any moisture or particles from leaking into the substrate 3101. The buffer layer 3102 is formed on the substrate 3101 to provide a flat surface.

The active layer 3103 is formed with a set pattern (such as a predetermined pattern) on the buffer layer 3102. The active layer 3103 may include an inorganic semiconductor material such as silicon, an organic semiconductor material, or an oxide semiconductor material. The active layer 3103 may be formed of a p-type or n-type dopant that is selectively inserted into the active layer 3103.

The gate insulating layer 3104 is formed on the active layer 3103. The gate electrode 3105 is formed on top of the gate insulating layer 3104 to correspond to a portion of the active layer 3103.

The insulating interlayer 3106 is formed to cover the gate electrode 3105. The source electrode 3107 and the drain electrode 3108 are formed on the insulating interlayer 3106 and in contact with set areas (such as predetermined areas) of the active layer 3103.

A passivation layer 3118 is formed to cover the source electrode 3107 and the drain electrode 3108. Another insulating layer may be additionally formed on the passivation layer 3118 to provide a flat surface above the TFT.

The first electrode 3121 is formed on the passivation layer 3118. The first electrode 3121 is electrically connected to either the source electrode 3107 or the drain electrode 3108 (as shown).

The pixel defining layer 3119 is formed on the first electrode 3121. The pixel defining layer 3119 is not to cover at least a portion of the top of the first electrode 3121. The intermediate layer 3123 that includes the organic light emitting layer is formed on the first electrode 3121. The second electrode 3122 is formed on the intermediate layer 3123.

The encapsulating layer 3700 is formed on the second electrode 3122. The encapsulating layer 3700 includes an inorganic layer or an organic layer. At least the organic layer of the encapsulating layer 3700 is formed through one of the deposition apparatuses 100, 200, 300, or 400 of the previous embodiments of the present invention. The encapsulating layer 3700 has a composition that is similar to the compositions of the encapsulating layer 1700 FIGS. 6 to 8 and the encapsulating layer 2700 of FIG. 9. Therefore, a detailed description thereof will not be repeated.

One or more inorganic layers or organic layers may be additionally provided on the encapsulating layers 1700, 2700, and 3700.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents. Therefore, the scope of protection of the present invention is to be decided based upon the appended claims and equivalents thereof.

What is claimed is:

1. A method of forming a thin film deposition layer on a substrate by using a deposition apparatus, the method comprising:
    forming, on the substrate, an inorganic layer; and
    forming, on the inorganic layer, an organic layer to cover one or more particles on the inorganic layer and to have a curved surface corresponding to a shape of each of the one or more particles, the forming of the organic layer comprising:
        spraying one or more depositing materials toward the substrate by using a deposition source of the deposition apparatus while the substrate is on a cooling stage of the deposition apparatus; and
        hardening the one or more depositing materials by irradiating the one or more depositing materials using a hardening unit of the deposition apparatus after the one or more depositing materials have reached the substrate.

2. The method of claim 1, wherein the one or more depositing materials comprise an organic material.

3. A method of manufacturing an organic light emitting display apparatus, the method comprising:
    forming, on a substrate, an organic light emitting device that comprises a first electrode, a second electrode, and an intermediate layer that comprises an organic light emitting layer; and
    forming, on the organic light emitting device, an encapsulating layer that comprises an inorganic layer and an organic layer, the forming of the encapsulating layer comprising:
        forming the inorganic layer; and
        forming the organic layer to cover one or more particles on the inorganic layer and to have a curved surface corresponding to a shape of each of the one or more particles,
    wherein the forming of the organic layer comprises spraying a depositing material comprising an organic material toward the substrate by using a deposition source while the substrate is on a cooling stage, and
    wherein the forming of the organic layer further comprises hardening the depositing material by irradiating the one or more depositing materials using a hardening unit after the sprayed depositing material has reached the substrate.

4. The method of claim 1, wherein the irradiating the one or more depositing materials using the hardening unit comprises radiating the one or more depositing materials with ultraviolet light.

5. The method of claim 1, wherein:
    the cooling stage of the deposition apparatus cools a first side of the one or more depositing materials on the substrate, and
    the irradiating the one or more depositing materials using the hardening unit of the deposition apparatus comprises irradiating a second side of the one or more depositing materials on the substrate opposite the first side.

* * * * *